(12) United States Patent
Sakuma

(10) Patent No.: US 8,429,964 B2
(45) Date of Patent: Apr. 30, 2013

(54) THERMAL FLUID FLOW SENSOR HAVING STACKED INSULATING FILMS ABOVE AND BELOW HEATER AND TEMPERATURE-MEASURING RESISTIVE ELEMENTS

(75) Inventor: Noriyuki Sakuma, Kodaira (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 274 days.

(21) Appl. No.: 12/633,142

(22) Filed: Dec. 8, 2009

(65) Prior Publication Data

US 2010/0139391 A1  Jun. 10, 2010

(30) Foreign Application Priority Data

Dec. 8, 2008 (JP) ................................ 2008-312359

(51) Int. Cl.
*G01F 1/68* (2006.01)
(52) U.S. Cl.
USPC ..................................... 73/204.26
(58) Field of Classification Search .................. None
See application file for complete search history.

(56) References Cited

U.S. PATENT DOCUMENTS

| | | | |
|---|---|---|---|
| 6,240,777 B1 | 6/2001 | Treutler et al. | |
| 6,450,025 B1 | 9/2002 | Wado et al. | |
| 6,490,915 B2* | 12/2002 | Yamada et al. | 73/114.34 |
| 6,523,403 B1 | 2/2003 | Fuertsch et al. | |
| 6,923,053 B2* | 8/2005 | Yamada et al. | 73/204.26 |
| 7,228,614 B2* | 6/2007 | Yamada et al. | 29/595 |
| 7,487,675 B2 | 2/2009 | Ikawa et al. | |
| 2001/0015199 A1* | 8/2001 | Yamada et al. | 123/494 |
| 2003/0019290 A1 | 1/2003 | Iwaki et al. | |
| 2003/0183000 A1* | 10/2003 | Yamada et al. | 73/204.26 |
| 2005/0050953 A1* | 3/2005 | Yamada et al. | 73/204.26 |
| 2005/0186696 A1* | 8/2005 | Yamada et al. | 438/48 |
| 2007/0056366 A1 | 3/2007 | Sakuma et al. | |
| 2007/0113644 A1* | 5/2007 | Manaka et al. | 73/204.26 |
| 2008/0168650 A1 | 7/2008 | Sakuma | |
| 2009/0188314 A1 | 7/2009 | Sakuma | |
| 2011/0107832 A1* | 5/2011 | Sakuma | 73/204.26 |

FOREIGN PATENT DOCUMENTS

| | | |
|---|---|---|
| JP | 11-194043 A | 7/1999 |
| JP | 11-271123 A | 10/1999 |
| JP | 11-295127 A | 10/1999 |
| JP | 2001-141540 | 5/2001 |
| JP | 2002-131106 A | 5/2002 |
| JP | 2006-242941 | 9/2006 |
| JP | 2007-071737 A | 3/2007 |
| JP | 2008-170382 A | 7/2008 |
| JP | 2009-180504 A | 8/2009 |
| WO | 03/052355 | 6/2003 |

* cited by examiner

*Primary Examiner* — Harshad R Patel
(74) *Attorney, Agent, or Firm* — Miles & Stockbridge P.C.

(57) ABSTRACT

A thermal fluid flow sensor having a diaphragm structure body configured by an insulating film formed by stacking a film having compressive stress and a film having tensile stress on the top and bottom of a temperature-measuring resistive element and a heater resistive element which are processed by microprocessing is provided. The insulating film at a lower layer of the heater resistive element, a temperature-measuring resistive element for heater resistive element, upstream temperature-measuring resistive elements, and downstream temperature-measuring resistive elements, has films having compressive stress (a first insulating film, a third insulating film, and a fifth insulating film) and films having tensile stress (a second insulating film and a fourth insulating film) being alternately arranged, and two layers or more of the films having tensile stress are arranged.

18 Claims, 14 Drawing Sheets

THERMAL FLUID FLOW SENSOR HAVING STACKED INSULATING FILMS ABOVE AND BELOW HEATER AND TEMPERATURE-MEASURING RESISTIVE ELEMENTS

CROSS-REFERENCE TO RELATED APPLICATION

The present application claims priority from Japanese Patent Application No. JP 2008-312359 filed on Dec. 8, 2008, the content of which is hereby incorporated by reference into this application.

TECHNICAL FIELD OF THE INVENTION

The present invention relates to a thermal fluid flow sensor and a manufacturing technique of the thermal fluid flow sensor. More particularly, the present invention relates to a technique effectively applied to a thermal fluid flow sensor suitable for a thermal fluid flow meter which measures intake air of an internal-combustion engine.

BACKGROUND OF THE INVENTION

Among fluid flow sensors which are used in an air flow meter for measuring an intake air amount provided to an electronically-controlled fuel injection device for an internal-combustion engine in, e.g., vehicles, thermal fluid flow sensors are in the main stream because they can directly detect a mass amount of air.

Among those thermal fluid flow sensors, a thermal air flow sensor manufactured by the semiconductor micromachining technology particularly has attracted attention because it can reduce the manufacturing cost and can be driven with low power. As to such an air flow sensor, Japanese Patent Application Laid-Open Publication No. H11-194043 (Patent Document 1) discloses a technique of a diaphragm structure using platinum (Pt) for a heating element (heater) and a temperature detecting element (sensor), and eliminating a silicon (Si) film of the heater and a bottom portion of the sensor. In the diaphragm structure, layers above and below the heater and sensor are covered with an insulating layer and stress of these insulating layers combined is taken as a mild degree of tensile stress. Also, Japanese Patent Application Laid-Open Publication No. H11-271123 (Patent Document 2) discloses a configuration in which layers above and below a heater and a sensor are a compressive stress film each and a tensile stress film and these films are stacked to have top-bottom symmetry centering the heater in the configuration.

Japanese Patent Application Laid-Open Publication No. H11-295127 (Patent Document 3) relating to a flow sensor discloses a structure in which an insulating supporting film is formed on a surface of a plate-like base material, a plurality of heat sensitive resistive members are arranged on the supporting film, and the heat sensitive resistive members and the supporting film are covered with an insulating protective film.

Japanese Patent Application Laid-Open Publication No. 2002-131106 (Patent Document 4) relating to a thermal air flow meter discloses a structure of a micro heater having a thin-film heating portion provided on an upper surface of a cavity that is formed in a single crystal silicon substrate, the micro heater heating flowing gas to be measured. In the micro heater, the thin-film heating portion is configured by a heating resistive member, a temperature-measuring resistive member, an air-temperature-measuring resistive member, and a top thin film and a bottom thin film which are provided to sandwich these resistive members from above and below. Also, at least one of the top thin film and the bottom thin film is formed to include a tensile stress film and a water-resistance compressive stress film is formed to be stacked on a side of the tensile stress film facing the flowing gas.

SUMMARY OF THE INVENTION

The above-mentioned techniques, however, do not consider an influence from the wiring shape due to processings. When wirings of the sensor portion are subjected to microprocessing to obtain a high resistance value as required for an improvement in sensitivity, the pitch of the line width and line spacing is narrowed, and thus the coverage of the insulating film to be formed on the wirings are damaged, causing a shift in a remnant stress value of the insulating film which is designed to be a flat film.

Particularly, as to a film having tensile stress, since a silicon nitride film having very large remnant stress per unit film thickness is used, an influence of unevenness becomes large when the film is formed thinner, resulting in a change of the remnant stress of the wiring portion underwent microprocessing to compressive stress, and thus a deflection occurs in the film due to an imbalance of stress in the diaphragm to change the resistance values of the heater and sensor. A temperature difference ($\Delta Th$) to be a reference is calculated from the resistance values of the heater and sensor. Thereby, when the diaphragm is operated as being set by a setting value while the resistance value is being changed, problems such as a lowering in detection accuracy due to a lowering in $\Delta Th$, a destruction of the film structure due to abnormal heating of the heater by an excess current, and so forth occur.

While there are a planarizing processing using the spin on glass for reducing unevenness on the wiring and a planarizing technique of insulating films by the CMP method, as the wiring pattern on the diaphragm has a large variation in roughness and denseness, the total film thickness of the insulating film in the diaphragm has a large difference between a portion without the wirings and the heater portion and the sensor portion of the microprocessed wirings, resulting in a deflection due to an imbalance of stress.

A preferred aim of the present invention is to eliminate the deflection of the diaphragm due to an imbalance of stress even when microprocessing of wirings is performed and to provide a thermal fluid flow sensor having a high detection accuracy in a flow measurement.

The above and other preferred aims and novel characteristics of the present invention will be apparent from the description of the present specification and the accompanying drawings.

The typical ones of the inventions disclosed in the present application will be briefly described as follows.

The preferred aim of the present invention is achieved by adding a film having tensile stress compensating a lack of tensile stress of the upper layer to an insulating film of a layer below the sensor which requires microprocessing to adjust the film thickness.

More specifically, a thermal fluid flow sensor of the present invention is a thermal fluid flow sensor for measuring an air flow having a heating resistive member provided in a diaphragm structure and a temperature-measuring resistive member provided next to the heating resistive member. The thermal fluid flow sensor has an insulating film formed by stacking a first film having tensile stress and a second film having compressive stress, the insulating film being formed to an upper layer and a lower layer of the heating resistive member and the temperature-measuring resistive member. At least the insulating film at the lower layer of the temperature-measuring resistive member has the first film and the second film being alternately formed having two or more first films.

The effects obtained by typical aspects of the present invention will be briefly described below.

When a film having tensile stress equivalent to tensile stress of an upper layer of the sensor is added to a lower layer of the sensor, the tensile stress can be larger than remnant stress of a setting value of the heater, and thus deflection in the diaphragm including the sensor portion underwent a microprocessing is prevented so that a thermal fluid flow sensor having a high accuracy and small resistance fluctuation is provided.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Also, it is needless to say that the expression "(be) formed of an element A" or "comprising an element A" or the like used for describing the components in the embodiments does not limit the element to the cited one(s) unless otherwise stated that the element is limited to the cited one(s).

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, regarding material etc., specified material is main material and thus do not eliminate secondary elements, additives, and added components unless otherwise stated that the specified material is not a main one or the specified material is not a main one in principle or in the situation.

Also, components having the same function are denoted by the same reference symbols throughout the drawings for describing the embodiments, and the repetitive description thereof is omitted.

Also, in some drawings used in the embodiments, hatching is used even in a plan view so as to make the drawings easy to see.

Hereinafter, the embodiments of the present invention will be described in detail with reference to the drawings.

First Embodiment

Figure 1:
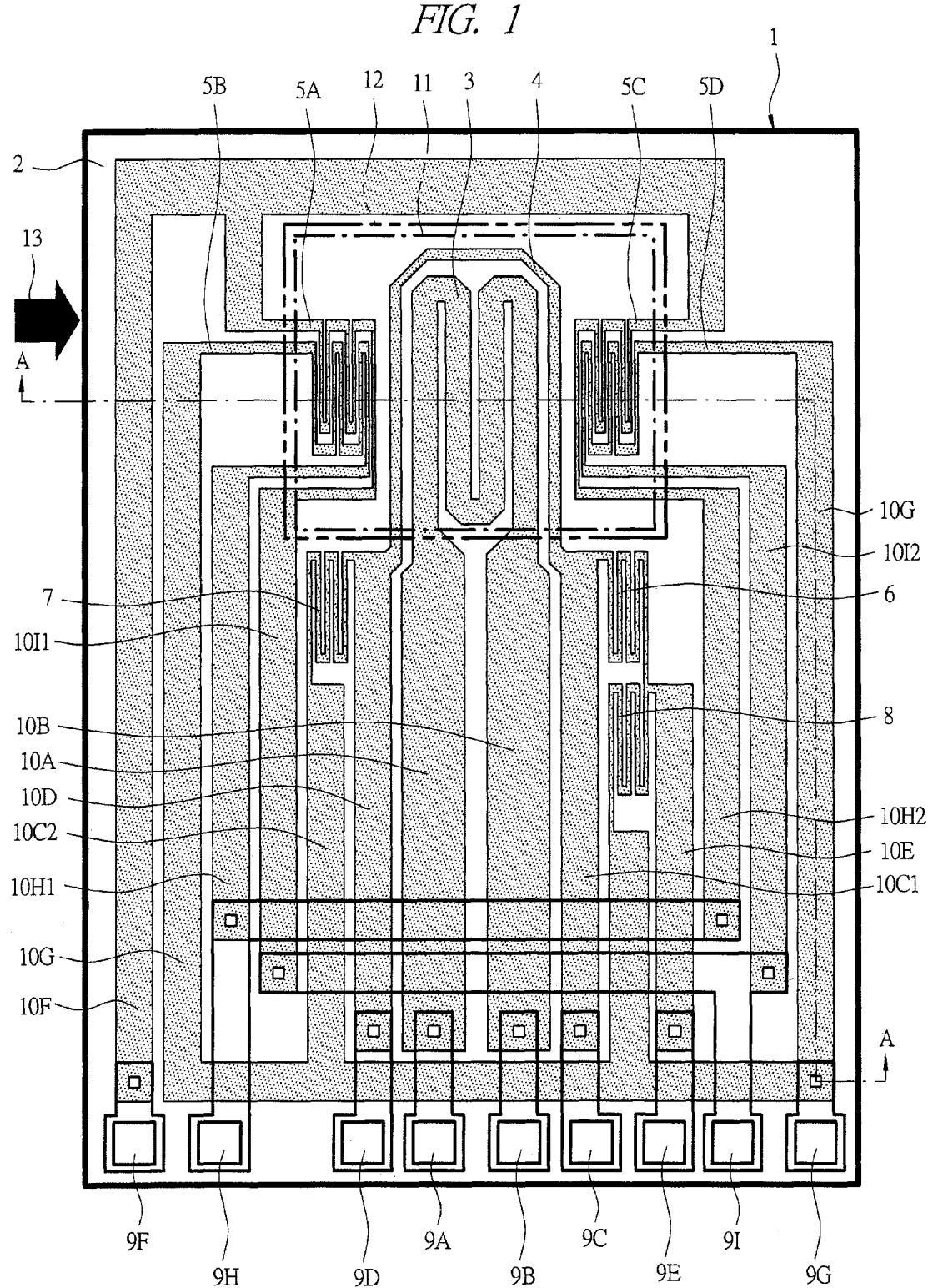
FIG. 1 is a plan view of main parts illustrating an example of a thermal fluid flow sensor according to a first embodiment of the present invention.

A plan view of main parts of an example of a thermal fluid flow sensor according to a first embodiment is illustrated in FIG. 1.

A measuring element 1 which is the thermal fluid flow sensor of the first embodiment is composed of a semiconductor substrate 2, a heater resistive element 3, a temperature-measuring resistive element for heater resistive element 4, a temperature-measuring resistive element, an air-temperature-measuring resistive element 6, heater-temperature-controlling resistive elements 7 and 8, terminal electrodes 9A to 9I, and draw-out wirings 10A, 10B, 10C1, 10C2, 10D, 10E, 10F, 10G, 10H1, 10H2, 10I1, and 10I2, etc.

The semiconductor substrate 2 is formed of, for example, single crystal silicon (Si).

The heater resistive element 3 is formed on the semiconductor substrate 2 interposing an insulating film, and has a wiring width of, for example, about 1 to 150 µm.

The temperature-measuring resistive element for heater resistive element 4 is used for detecting temperature of the heater resistive element 3, and has a wiring width of, for example, about 0.5 to 100 μm.

The temperature-measuring resistive element is composed of two upstream temperature-measuring resistive elements 5A and 5B and two downstream temperature-measuring resistive elements 5C and 5D, and used for detecting the temperature of the air warmed by the heater resistive element 3. Wiring widths of the upstream temperature-measuring resistive elements 5A and 5B and the downstream temperature-measuring resistive elements 5C and 5D are, for example, about 0.5 to 10 μm.

The air-temperature-measuring resistive element 6 is used for measuring the air temperature, and has a wiring width of, for example, about 0.5 to 10 μm.

Wiring widths of the heater-temperature-controlling resistive elements 7 and 8 are, for example, 0.5 to 10 μm.

The terminal electrodes 9A to 9I are used for connecting signals of the temperature-measuring element 1 to an external circuit(s).

The draw-out wiring 10A electrically connects the heater resistive element 3 to the terminal electrode 9A, and has a wiring width of, for example, about 30 to 500 μm.

The draw-out wiring 10B electrically connects the heater resistive element 3 to the terminal electrode 9B, and has a wiring width of, for example, about 30 to 500 μm.

The two draw-out wirings 10C1 and 10C2 (mainly, the draw-out wiring 10C1) electrically connect the heater-temperature-controlling resistive element 7 and the heater-temperature-controlling resistive element 8 to the terminal electrode 9C, and have wiring widths of, for example, about 30 to 500 μm.

The draw-out wiring 10D electrically connects the temperature-measuring resistive element for heater resistive element 4 and the heater-temperature-controlling resistive element 7 to the terminal electrode 9D, and has a wiring width of, for example, about 30 to 500 μm.

The draw-out wiring 10E electrically connects the air-temperature-measuring resistive element 6 and the heater-temperature-controlling resistive element 8 to the terminal electrode 9E, and has a wiring width of, for example, about 30 to 500 μm.

The draw-out wiring 10F electrically connects the upstream temperature-measuring resistive element 5A and the downstream temperature-measuring resistive element 5C to the terminal electrode 9F, and has a wiring width of, for example, about 30 to 500 μm.

The draw-out wiring 10G electrically connects the temperature-measuring resistive element for heater resistive element 4, the air-temperature-measuring resistive element 6, the upstream temperature-measuring resistive element 5B, and the downstream temperature-measuring resistive element 5D to the terminal electrode 9G, and has a wiring width of, for example, about 30 to 500 μm.

The two draw-out wirings 10H1 and 10H2 electrically connect the upstream temperature-measuring resistive element 5B, and the downstream temperature-measuring resistive element 5C to the terminal electrode 9H, and have wiring widths of, for example, about 30 to 500 μm.

The two draw-out wirings 10I1 and 10I2 electrically connect the upstream temperature-measuring resistive element 5A and the downstream temperature-measuring resistive element 5D to the terminal electrode 9I, and have wiring widths of, for example, about 30 to 500 μm.

Further, an opening 11 is provided to at least the heater resistive element 3, the temperature-measuring resistive element for heater resistive element 4, and a protective film provided on the temperature-measuring resistive element, and the Si substrate at the lower layer (semiconductor substrate 2) of the opening 11 is removed to have a diaphragm structure 12. Here, according to the diaphragm structure 12, an outer circumference of the opening 11 of the protective film is positioned inside of an outer circumference of the diaphragm structure 12 by more than or equal to 50 μm in the plane.

The measuring element 1 measures the air temperature of an air flow 13 by the air-temperature-measuring resistive element 6, and calculates a temperature difference ($\Delta$Th) by comparing the measured air temperature with a resistance increase of the temperature-measuring resistive element for heater resistive element 4 heated by the heater resistive element 3, and resistances of the temperature-measuring resistive elements 5A, 5B, 5C, and 5D are changed by the air flow warmed by the heater resistive element 3. Note that, in the first embodiment, the wiring structure is in a loopback meandering pattern to match the resistance values of the respective resistive elements and setting values.

Next, an example of a method of manufacturing the thermal fluid flow sensor according to the first embodiment will be described in sequence with reference to FIGS. 2 to 7.

Figure 2:
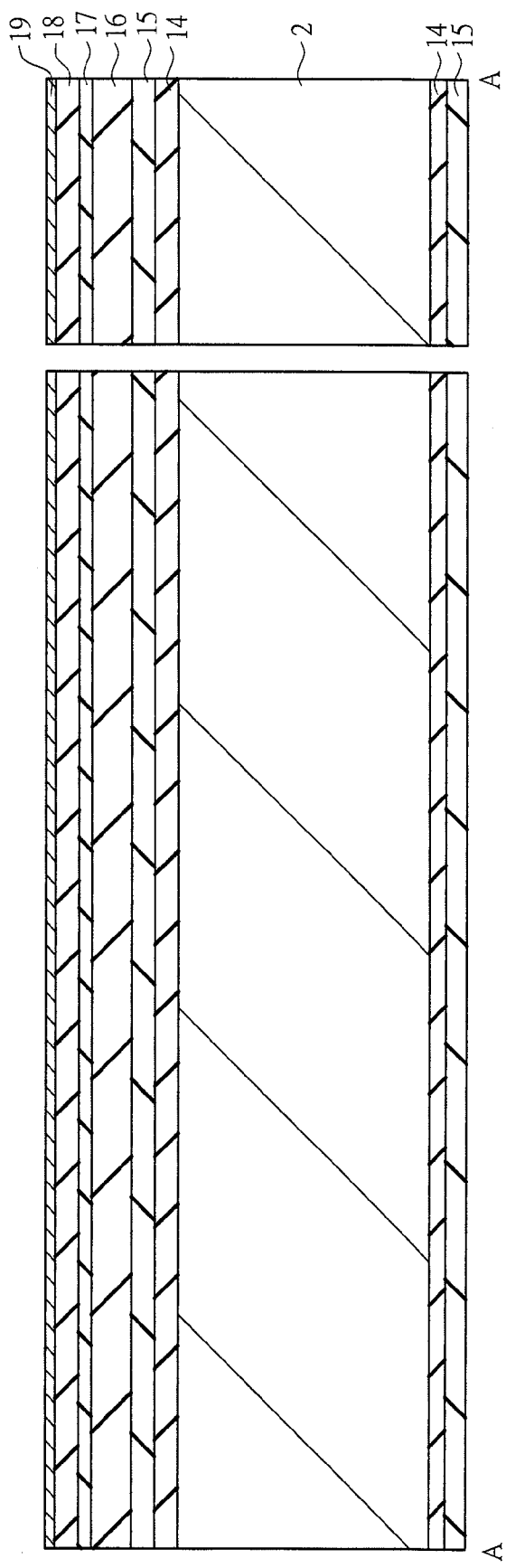
FIG. 2 is a plan view of main parts illustrating a manufacturing process of the thermal fluid flow sensor according to the first embodiment of the present invention.

First, as illustrated in FIG. 2, the semiconductor substrate 2 formed of single crystal silicon (Si) is prepared. Subsequently, a first insulating film 14 is formed on a main surface of the semiconductor substrate 2, and further, a second insulating film 15, a third insulating film 16, a fourth insulating film 17, and a fifth insulating film 18 are sequentially formed. The first insulating film 14 is, for example, a silicon oxide film formed in a furnace body at a high temperature, and has a thickness of about 200 nm. The second insulating film 15 is, for example, a silicon nitride film formed by using a CVD method, and has a thickness of about 100 to 200 nm. The first insulating film 14 and the second insulating film 15 are formed on a back surface of the semiconductor 2 also. The third insulating film 16 is a silicon oxide film formed by using a CVD method, and has a thickness of about 500 nm. The fourth insulating film 17 is a silicon nitride film formed by using a CVD method similarly to the second insulating film 15 or a silicon nitride film formed by using a plasma CVD method, and has a thickness in a range of about 20 to 200 nm as determined by the wiring pitch of the sensor portion. The fifth insulating film 18 is a silicon oxide film formed by, for example, a CVD method or a plasma CVD method, and has a thickness of 100 to 300 nm. Note that the first insulating film 14, the third insulating film 16, and the fifth insulating film 18 are films (second film) having compressive stress with remnant stress of about 50 to 250 MPa, and the second insulating film 15 and the fourth insulating film 17 are films (first film) having tensile stress of 700 to 1200 MPa. Also, the second insulating film 15 and the fourth insulating film 17 can be aluminum nitride films having tensile stress of 500 to 1200 MPa.

Next, as a first metal film 19, a Mo (molybdenum) film is formed by, for example, sputtering to be about 150 nm. Here, to improve adhesiveness and crystalline quality, the fifth insulating film 18 which is a base of the first metal film 19 is etched by 5 nm to 20 nm by sputtering etching using argon (Ar) gas before depositing the Mo film, and a temperature of the semiconductor substrate 2 upon depositing the Mo film is set at about 200 to 500° C. Also, to further improve the crystalline quality of the Mo film, a thermal treatment at about 1000° C. in a nitride atmosphere is performed in a furnace body or a lamp heating apparatus.

Figure 3:
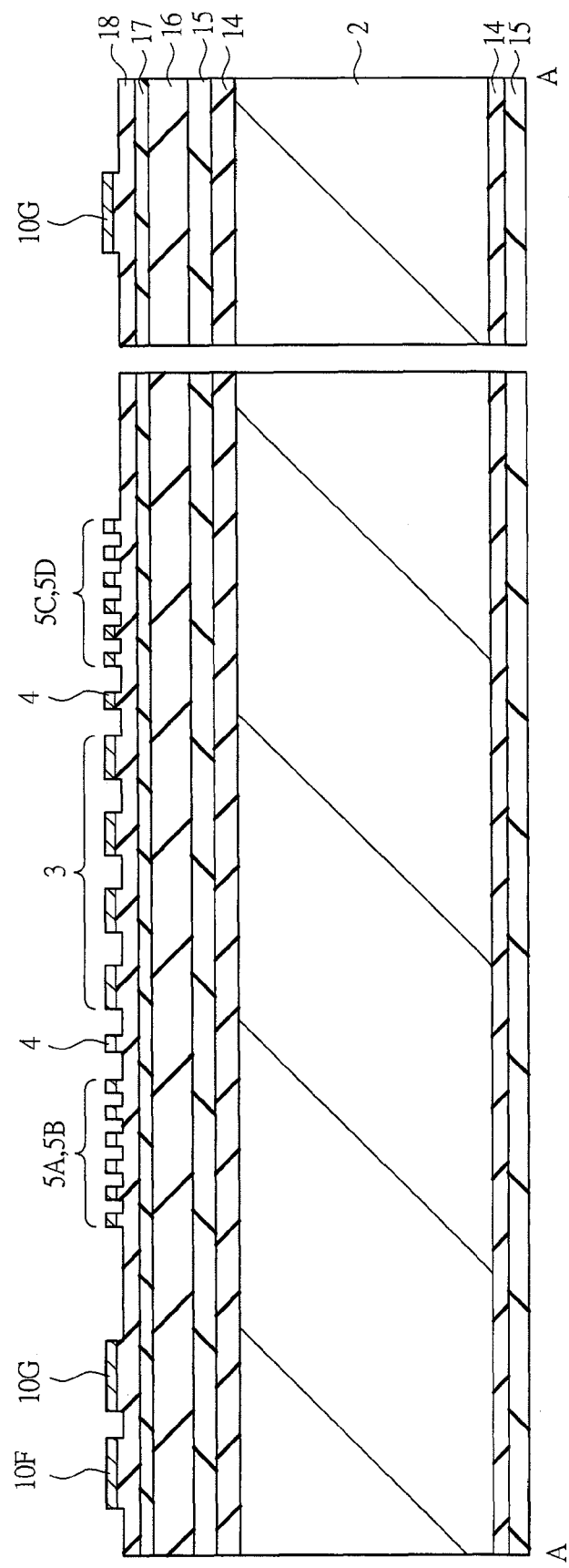
FIG. 3 is a cross-sectional view of main parts illustrating the thermal fluid flow sensor in the manufacturing process continued from FIG. 2.

Next, as illustrated in FIG. 3, the first metal film 19 is patterned by etching using photolithography to form the heater resistive element 3, the temperature-measuring resistive element for heater resistive element 4, the temperature-measuring resistive element (the upstream temperature-measuring resistive elements 5A and 5B, and the downstream temperature-measuring resistive elements 5C and 5D), the air-temperature-measuring resistive element 6, the heater-temperature-controlling resistive elements 7 and 8, and the draw-out wirings 10A to 10I2. Here, as the first metal film 19 is over-etched in the processing, the fifth insulating film 18 that is the base is etched by about 50 nm in regions where the first metal film 19 is not formed. Therefore, a step between the portion formed of the first metal film 19 such as the heater resistive element 3 and the portion formed of the fifth insulating film 18 formed by processing the first metal film 19 is about 200 nm in total.

Figure 4:
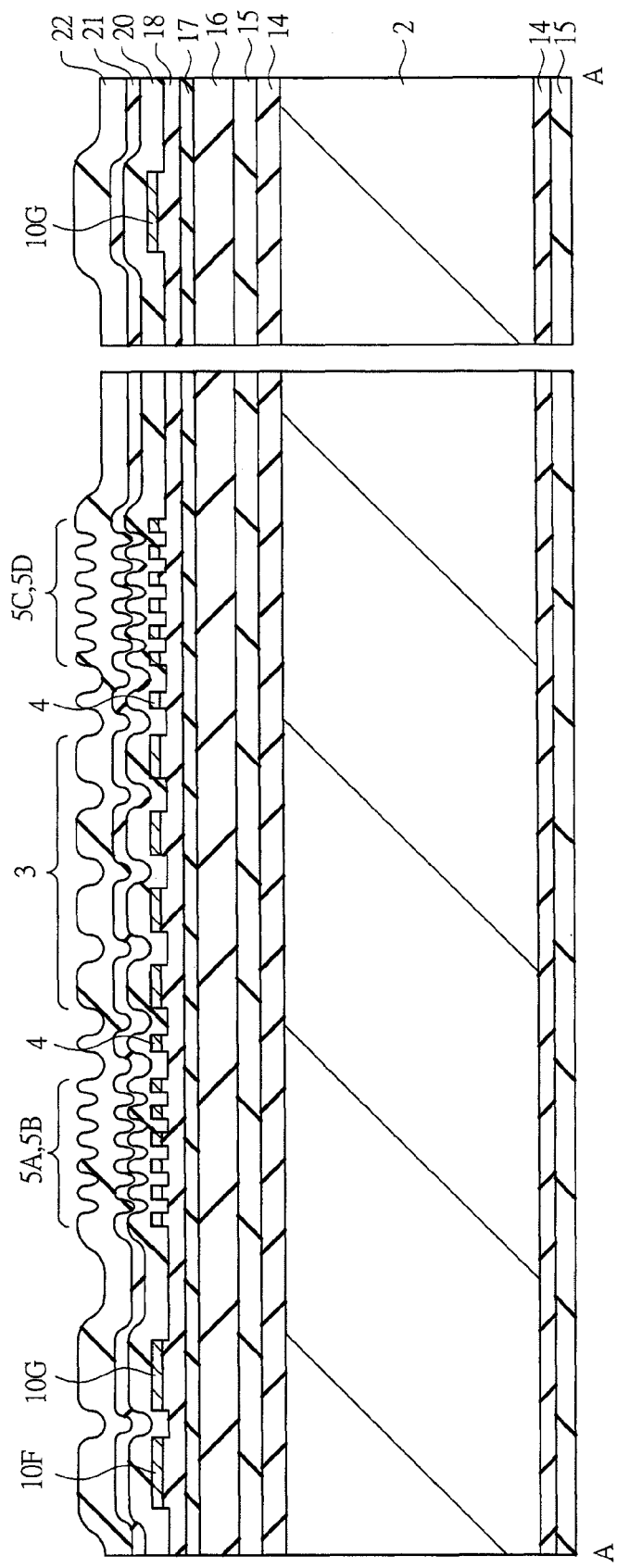
FIG. 4 is a cross-sectional view of main parts illustrating the thermal fluid flow sensor in the manufacturing process continued from FIG. 3.

Next, as illustrated in FIG. 4, a sixth insulating film 20, a seventh insulating film 21, and an eighth insulating film 22 are sequentially formed at the upper layer of the heater resistive element 3, the temperature-measuring resistive element for heater resistive element 4, the temperature-measuring resistive element 5 (the upstream temperature-measuring resistive elements 5A and 5B and the downstream temperature-measuring resistive elements 5C and 5D), the air-temperature-measuring resistive element 6, the heater-temperature-controlling resistive elements 7 and 8, and the draw-out wirings 10A to 10I2. The sixth insulating film 20 is a silicon oxide film deposited by, for example, a CVD method or a low-temperature CVD method using plasma with TEOS as a source, and has a thickness of about 500 nm. The seventh insulating film 21 is a silicon nitride film deposited by, for example, a CVD method or a low-temperature CVD method using plasma, and has a thickness of about 150 to 200 nm. The eighth insulating film 22 is a silicon oxide film deposited by, for example, a CVD method or a low-temperature CVD method using plasma with TEOS as a source, and has a thickness of about 100 to 500 nm. Note that the sixth insulating film 20 and the eighth insulating film 22 being silicon oxide films are films (second film) having compressive stress with remnant stress at the room temperature of about 50 to 250 MPa, and the seventh insulating film 21 being a silicon nitride film is a film (first film) having tensile stress with remnant stress at the room temperature of about 700 MPa to 1200 MPa. The reason of making the remnant stress (tensile stress) of the seventh insulating film 21 larger than the total remnant stress (compressive stress) of the sixth insulating film 20 and the eighth insulating film 22 in this manner is to prevent deflection of these insulating films to be caused when the temperature of actually using the thermal fluid flow sensor exceeds the temperature of forming these insulating films, making the total remnant stress of the sixth insulating film 20 and the eighth insulating film 22 be larger than the remnant stress of the seventh insulating film 21. Also, when the seventh insulating film 21 is formed of a silicon nitride film formed by a low-temperature CVD using plasma, the condition is adjusted to obtain desired tensile stress by performing a thermal treatment at 800° C. or higher, preferably, about 1000° C. As to the silicon oxide films as the sixth insulating film 20 and the eighth insulating film 22, it is preferable to perform a thermal treatment after depositing the silicon oxide films because a thermal treatment at about 1000° C. improves the humidity resistance.

Figure 5:
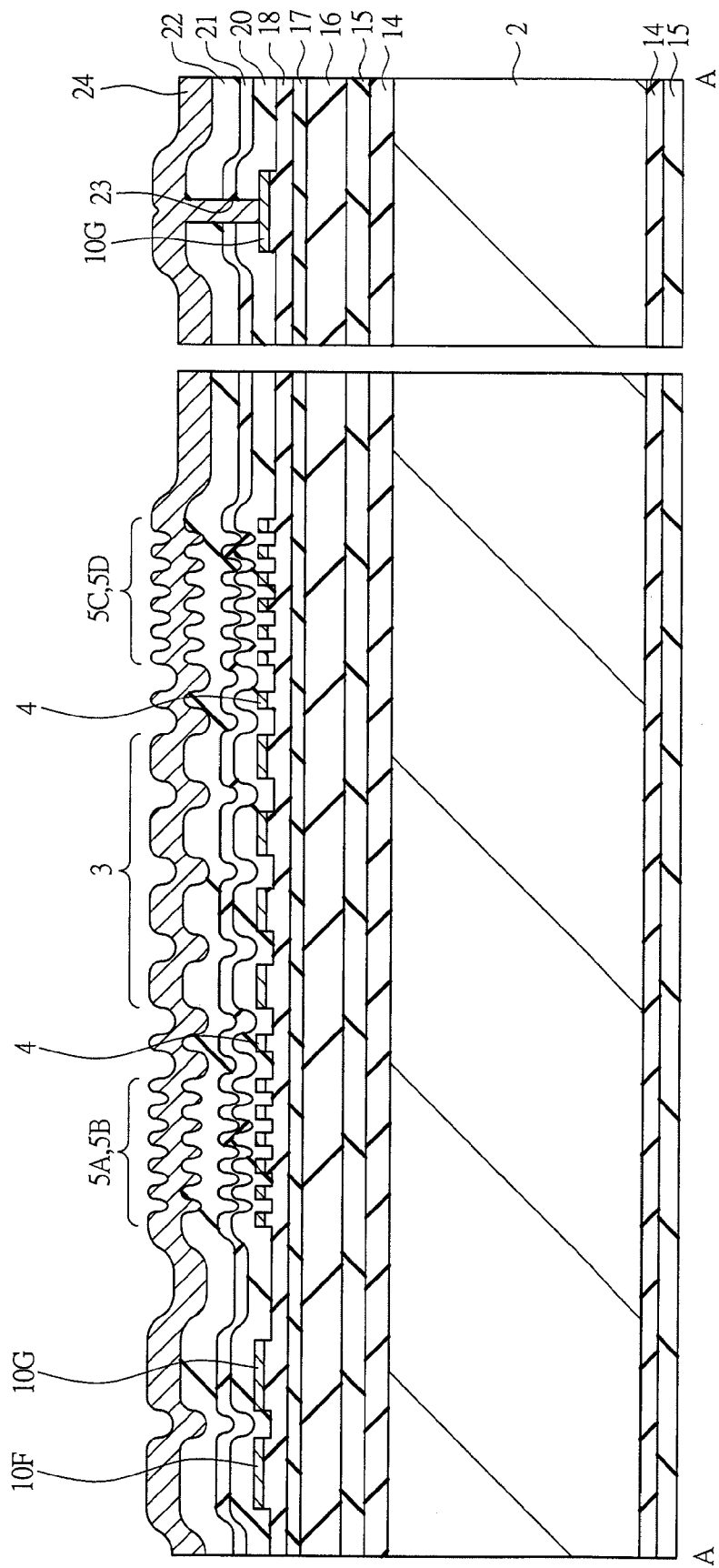
FIG. 5 is a cross-sectional view of main parts illustrating the thermal fluid flow sensor in the manufacturing process continued from FIG. 4.

Next, as illustrated in FIG. 5, a connection hole 23 which exposes a part of the draw-out wirings 10A to 10I2 is formed by dry etching or wet etching using a photolithography method. Incidentally, in FIG. 5, other connection holes 23 than the connection hole 23 reaching the draw-out wiring 10G are not illustrated. Then, as a second metal film 24, an Al (aluminum) alloy film of about 1 µm thick is deposited to bury the connection hole 23. Note that the surface of the draw-out wirings 10A to 10I2 can be subjected to sputtering etching by Ar (argon) gas before forming the second metal film 24 to make the contact between the second metal film 24 and the draw-out wiring 10G better. Further, to make the contact surer, a barrier metal film of, for example, a TiN (titanium nitride) film can be formed as a third metal film before depositing the Al alloy film to form a stacked film of the barrier metal film and the Al alloy film. Note that the contact resistance is increased when the barrier metal film is formed to be relatively thick, the thickness of the barrier metal film is preferable to be about 20 nm. Meanwhile, if the problem of increasing resistance can be avoided as an efficient contact area is ensured, the thickness of the barrier metal film can be smaller than or equal to 200 nm. Also, while the TiN film has been exemplified as the barrier metal film, a TiW (titanium tungsten) film, a Ti (titanium) film, or a stacked film of a TiW film and a Ti film can be used.

Figure 6:
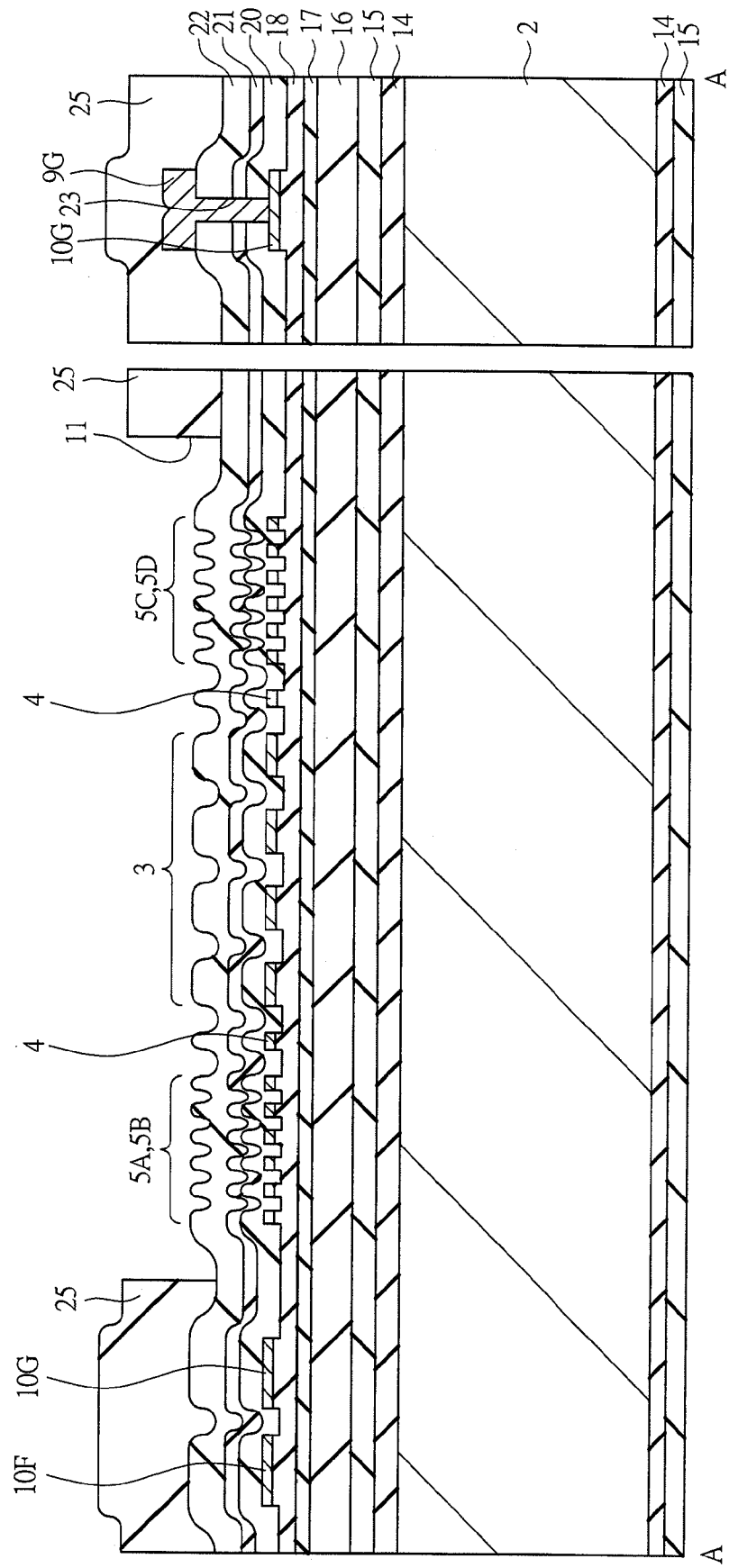
FIG. 6 is a cross-sectional view of main parts illustrating the thermal fluid flow sensor in the manufacturing process continued from FIG. 5.

Next, as illustrated in FIG. 6, the second metal film 24 is patterned by dry etching or wet etching using a photolithography method to form the terminal electrodes 9A to 9I. Next, as a protective film 25 on the terminal electrodes 9A to 9I, e.g., a polyimide film is formed, and the opening 11 and an opening (not illustrated) for connecting the terminal electrodes 9A to 9I and the external circuit(s) are formed on at least the heater resistive element 3, the temperature-measuring resistive element for heater resistive element 4, the upstream temperature-measuring resistive elements 5A and 5B, and the downstream temperature-measuring resistive elements 5C and 5D by etching using a photolithography method. Note that the protective film 25 can be a photosensitive organic film having a thickness of 2 to 3 µm.

Figure 7:
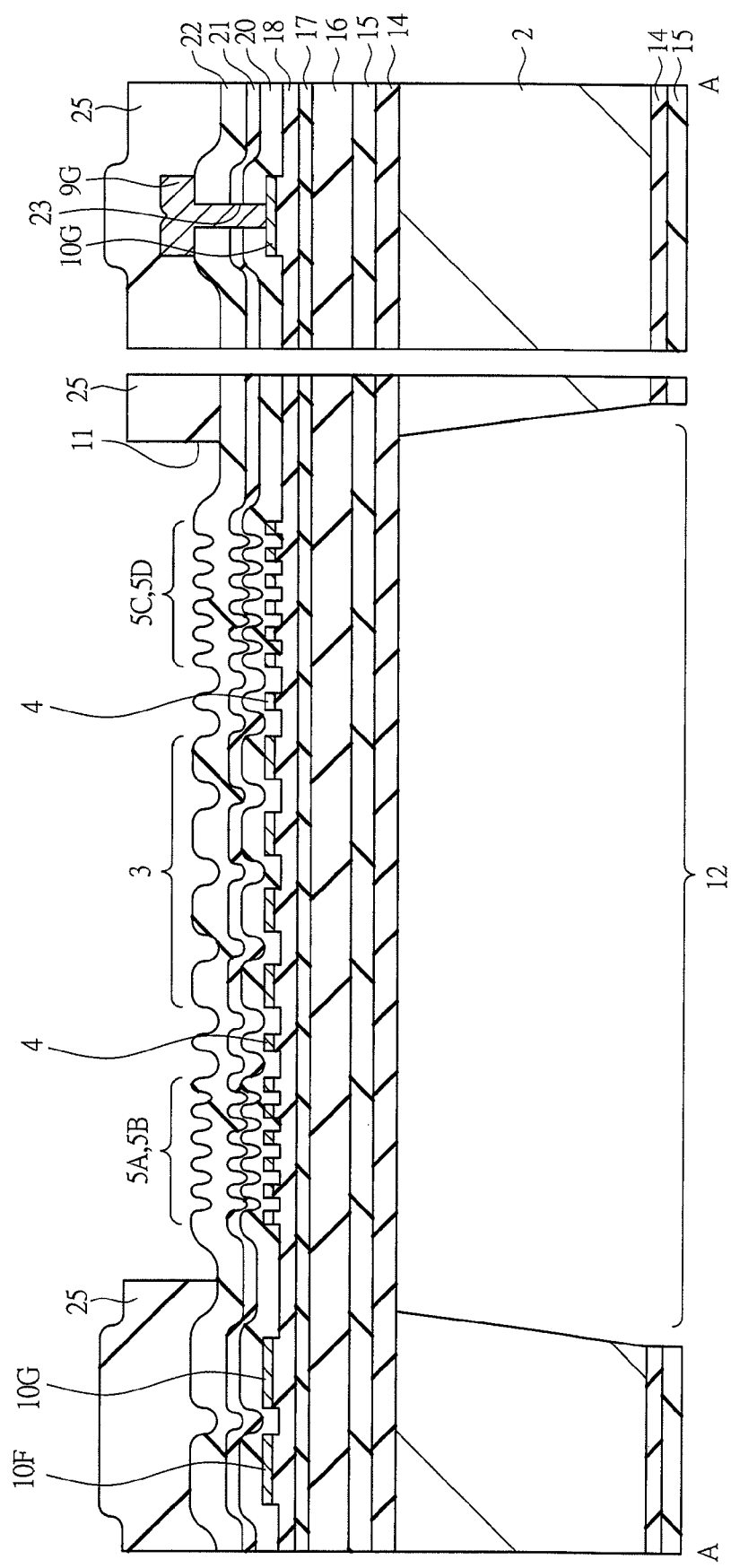
FIG. 7 is a cross-sectional view of main parts illustrating the thermal fluid flow sensor in the manufacturing process continued from FIG. 6.

Next, as illustrated in FIG. 7, a pattern (not illustrated) of a photoresist film is formed on the back surface of the semiconductor substrate 2 by a photolithography method, and the first insulating film 14 and the second insulating film 15 formed on the back surface are removed by dry etching or wet etching. Then, the semiconductor substrate 2 is subjected to wet etching from the back surface in KOH (potassium hydroxide), TMAH (Tetramethylammonium hydroxide), or a solution containing KOH and/or TMAH using the remained part of the first insulating film 14 and the second insulating film 15 as a mask so that the diaphragm structure 12 is formed. The diaphragm structure 12 is designed to be larger than the opening 11 of the protective film 25, more preferably, is formed to be larger than every side lines of the opening 11 of the protective film 25 by 50 µm or more. The total thickness of the insulating films (the first insulating film 14, second insulating film 15, third insulating film 16, fourth insulating film 17, fifth insulating film 18, sixth insulating film 20, seventh insulating film 21, and eighth insulating film 22) configured in the diaphragm structure 12 is preferably larger than or equal to 1.5 µm. When the total thickness is thinner than 1.5 µm, the strength of the insulating films configured in the diaphragm structure 12 is lowered, and a fear of destroying the structure by collision of dusts contained in the intake air of a vehicle is increased. However, the first insulating film 14 plays a role of a buffering film against dust collision from below. If the configuration is designed not to have dust collision, the first insulating film 14 can be omitted.

Note that, in the present embodiment described in the foregoing, while a thermal fluid flow sensor in which the first metal film 19 to be the heater resistive element 3 etc. is formed of Mo has been described, the first metal film 19 can be formed of other materials such as a metal other than Mo, a metal nitride compound, a metal silicide compound, polycrystalline silicon, or polycrystalline silicon in which phosphorus or boron is doped as an impurity. When a metal is used, a metal containing, for example, α-Ta (alpha tantalum), Ti (titanium), W (tungsten), Co (cobalt), Ni (nickel), Fe (iron), Nb (niobium), Hf (hafnium), Cr (chrome), Zr (zirconium), or the like as its main component can be exemplified. When a metal nitride compound is used, TaN (tantalum nitride), MoN (molybdenum nitride), WN (tungsten nitride), or the like can be exemplified. When a metal silicide compound is used, MoSi (molybdenum silicide), CoSi (cobalt silicide), NiSi (nickel silicide), or the like can be exemplified.

Also, while breakage of the diaphragm structure 12 due to water pressure in a chip-dicing process after completing processes to the semiconductor substrate 2 in a wafer state is considered, there is no problem in the strength when the total film thickness of the stacked insulating film (the first insulating film 14, second insulating film 15, third insulating film 16, fourth insulating film 17, fifth insulating film 18, sixth insulating film 20, seventh insulating film 21, and eighth insulating film 22) configured in the diaphragm structure 12 is larger than or equal to 1.5 μm.

Figure 8:
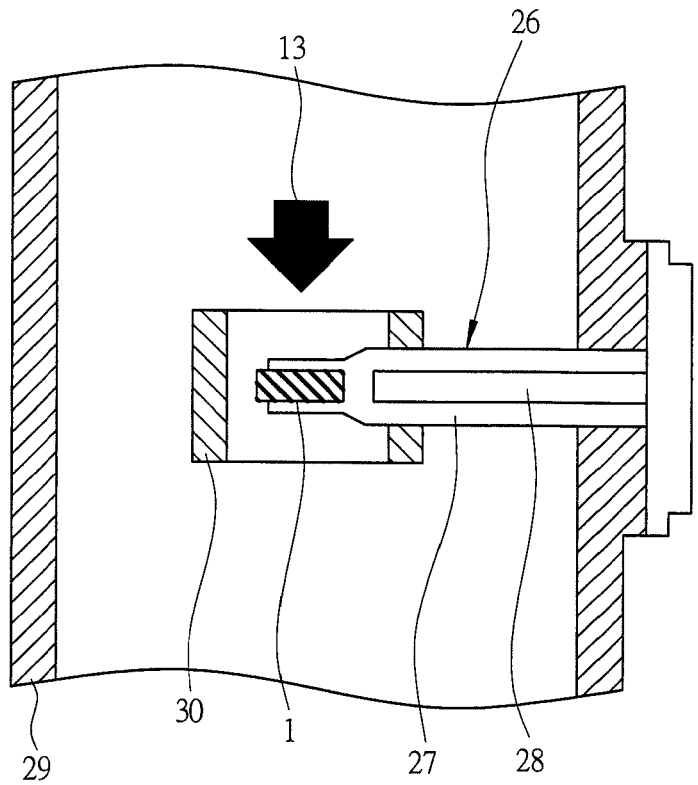
FIG. 8 is a schematic layout diagram illustrating a thermal fluid flow meter attached to an air intake path of an internal-combustion engine of, e.g., a vehicle, the thermal fluid flow meter having the thermal fluid flow sensor of the first embodiment of the present invention mounted thereto.

FIG. 8 is a schematic layout diagram of a thermal fluid flow meter attached to an air intake path of an internal-combustion engine of a vehicle or the like, on which the thermal fluid flow sensor according to the first embodiment is mounted. A thermal fluid flow meter 26 is formed of the measuring element 1 described above that is the thermal fluid flow sensor, a supporting member 27 having an upper portion and a lower portion, and an external circuit 28, the measuring element 1 being arranged in a by-path 30 provided inside an air path 29. The external circuit 28 is electrically connected to the terminals of the measuring element 1 via the supporting member 27. The taken-in air flows in a direction of an air flow illustrated by the arrow (air flow 13) in FIG. 8 or a direction opposite to that.

Figure 9:
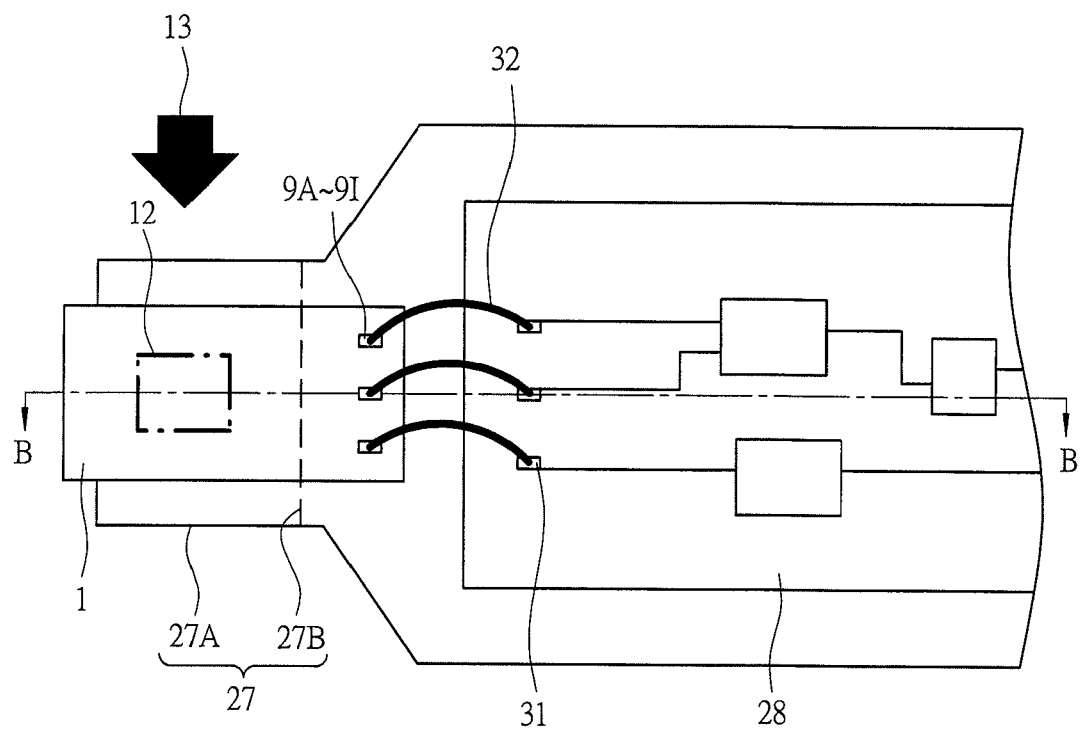
FIG. 9 is a plan view of main parts illustrating a part of FIG. 8 in an enlarged manner.
Figure 10:
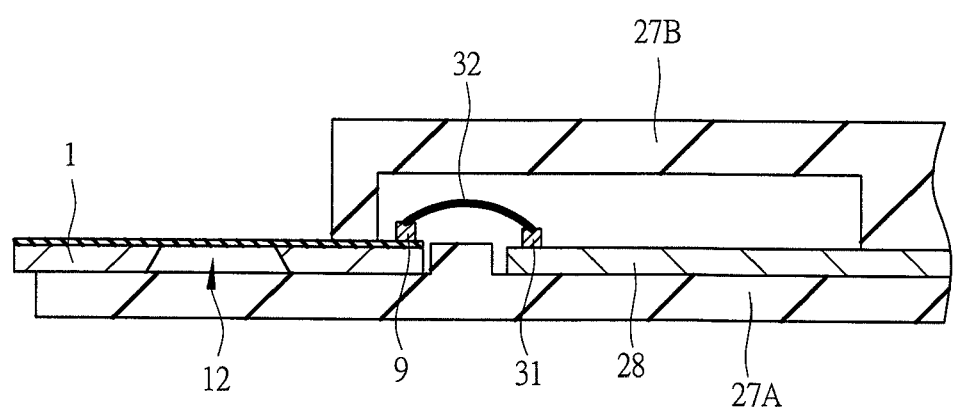
FIG. 10 is a cross-sectional view of main parts taken along the line B-B of FIG. 9.

FIG. 9 is a plan view of main parts illustrating a part of FIG. 8 described above (the measuring element 1 and the supporting member 27) in an enlarged manner. FIG. 10 is a cross-sectional view of main parts taken along the line B-B of FIG. 9.

As illustrated in FIGS. 9 and 10, the measuring element 1 is fixed on the supporting member 27A at the lower portion, and each of the terminal electrodes 9A to 9I of the measuring element 1 and terminal electrode 31 of the external circuit 28 are electrically connected by a wire-bonding method using, for example, a gold wire 32 or the like. The terminal electrodes 9A to 9I and the gold wires 32 are protected as being covered by the supporting member 27B at the upper portion. The upper portion of the supporting member 27B can be a sealing protection by a resin.

Figure 11:
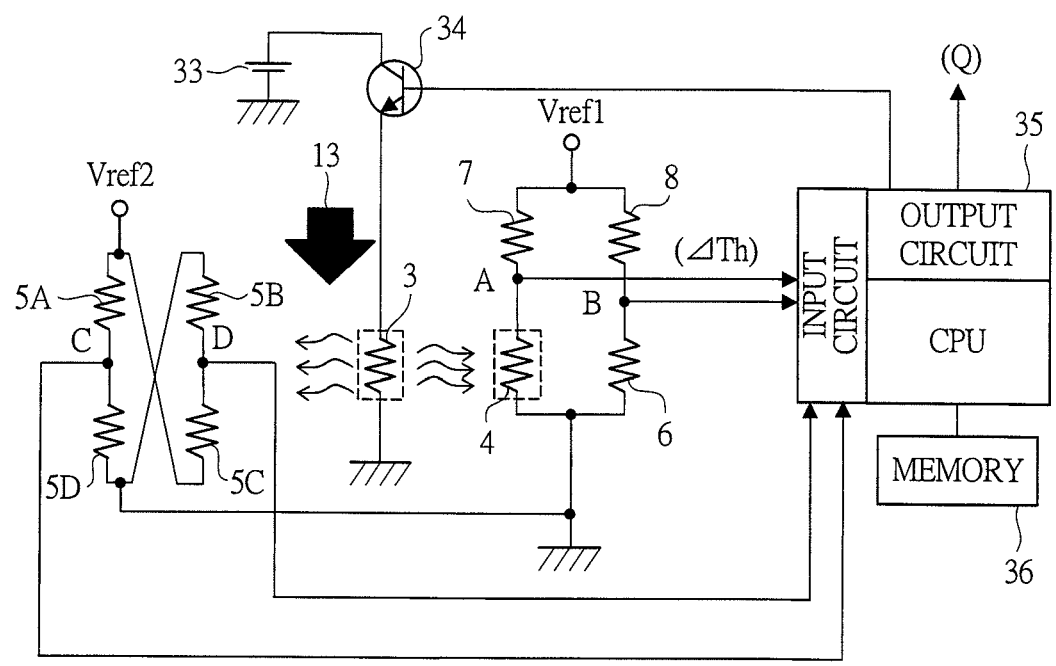
FIG. 11 is a circuit diagram illustrating an example of the thermal fluid flow sensor according to the first embodiment of the present invention.

Next, with reference to FIG. 11, an operation of the thermal fluid flow meter 26 described above will be described. FIG. 11 is a circuit diagram illustrating the measuring element 1 according to the first embodiment and the external circuit 28, in which the reference numeral 33 denotes a power source, the reference numeral 34 denotes a transistor for flowing a heating current to the heater resistive element 3, the reference numeral 35 denotes a control circuit configured by an output circuit including an A/D converter and the like and a CPU (central processing unit) performing arithmetic processing, and the reference numeral 36 denotes a memory circuit.

The circuit illustrated in FIG. 11 has two bridge circuits, one of them is a heater-controlling bridge circuit composed of the temperature-measuring resistive element for heater resistive element 4, the air-temperature-measuring resistive element 6, and the heater-temperature-controlling resistive elements 7 and 8, and the other is a temperature-sensor bridge circuit composed of the four temperature-measuring resistive elements (the upstream temperature-measuring resistive elements 5A and 5B and the downstream temperature-measuring resistive elements 5C and 5D).

In the measuring element 1 illustrated in FIG. 1, the terminal electrode 9C is electrically connected to both of the two heater-temperature-controlling resistive elements 7 and 8 via the two draw-out wirings 10C1 and 10C2 (mainly, the draw-out wiring 10C1), and a predetermined potential Vref1 is supplied to the terminal electrode 9C. Also, the terminal electrode 9F is electrically connected to both of the upstream temperature-measuring resistive element 5A and the downstream temperature-measuring resistive element 5C, and a predetermined potential Vref2 is supplied to the terminal electrode 9F. Further, the terminal electrode 9G is electrically connected to the air-temperature-measuring resistive element 6, the temperature-measuring resistive element for heater resistive element 4, the upstream temperature-measuring resistive element 5B, and the downstream temperature-measuring resistive element 5D, respectively, via the draw-out wiring 10G, and the terminal electrode 9G is at a ground potential as illustrated in FIG. 11.

The terminal electrode 9D electrically connected to both of the temperature-measuring resistive element for heater resistive element 4 and the heater-temperature-controlling resistive element 7 via the draw-out wiring 10D corresponds to a node A in FIG. 11.

Also, the terminal electrode 9E electrically connected to both of the air-temperature-measuring resistive element 6 and the heater-temperature-controlling resistive element 8 via the draw-out wiring 10E corresponds to a node B in FIG. 11. Further, the terminal electrode 9I electrically connected to both of the upstream temperature-measuring resistive element 5A and the downstream temperature-measuring resistive element 5D via the two draw-out wirings 10I1 and 10I2 corresponds to a node C in FIG. 11. Moreover, the terminal electrode 9H electrically connected to both of the upstream temperature-measuring resistive element 5B and the downstream temperature-measuring resistive element 5C via the two draw-out wirings 10H1 and 10H2 corresponds to a node D in FIG. 11.

Note that, while the ground potential of the heater-controlling bridge circuit and the temperature-sensor bridge circuit is supplied to the common terminal electrode 9G in the present embodiment, the number of terminal electrodes can be increased to make each of the terminal electrodes to be the ground potential.

In the heater-controlling bridge circuit, respective resistance values of the temperature-measuring resistive element for heater resistive element 4, the air-temperature-measuring resistive element 6, and the heater-temperature-controlling resistive elements 7 and 8 are set to make a potential difference between the node A (terminal electrode 9D) and the node B (terminal electrode 9E) to be 0 V when a gas heated by the heater resistive element 3 is at a temperature higher than the intake air temperature by a fixed temperature (ΔTh, e.g., 100° C.). When the above-mentioned fixed temperature (ΔTh) is shifted from the setting value, a potential difference is generated between the node A and the node B. The heater-controlling bridge circuit is designed to change the current in the heater resistive element 3 with controlling the transistor 34 by the control circuit 35, so that the bridge circuit is maintained at an equilibrium state (potential difference between A and B is 0 V).

On the other hand, since the temperature-sensor bridge circuit is designed to have distances between the heater resistive element 3 to the respective temperature-measuring resistive elements (the upstream temperature-measuring resistive elements 5A and 5B and the downstream temperature-measuring resistive elements 5C and 5D) equal to each other, when it is calm, a potential difference between the node C (terminal electrode 9I) and the node D (terminal electrode 9H) is in an equilibrium state to be 0 V regardless of heating by the heater resistive element 3. When a voltage is applied to the heater resistive element 3 and the intake air flows in the direction of the air flow 13, the temperature of the upstream temperature-measuring resistive elements 5A and 5B warmed by the heater resistive element 3 is lowered and the temperature of the downstream temperature-measuring resistive elements 5C and 5D is increased, resulting in a difference in the resistance values between the upstream temperature-measuring elements and the downstream temperature-measuring elements in the temperature-measuring element. Thereby, an imbalance in the temperature-sensor bridge circuit is posed to generate a voltage difference between the node C and the node D. The voltage difference is inputted to the control circuit 35, and an air flow rate (Q) obtained by a comparison table of the voltage difference and the air flow rate recorded in the memory circuit 36 is arithmetically processed and outputted. Note that, even when the air flow 13 is in the opposite direction, the air flow rate can be measured in the same manner. Therefore, a reverse-flow detection is also possible.

Figure 12:
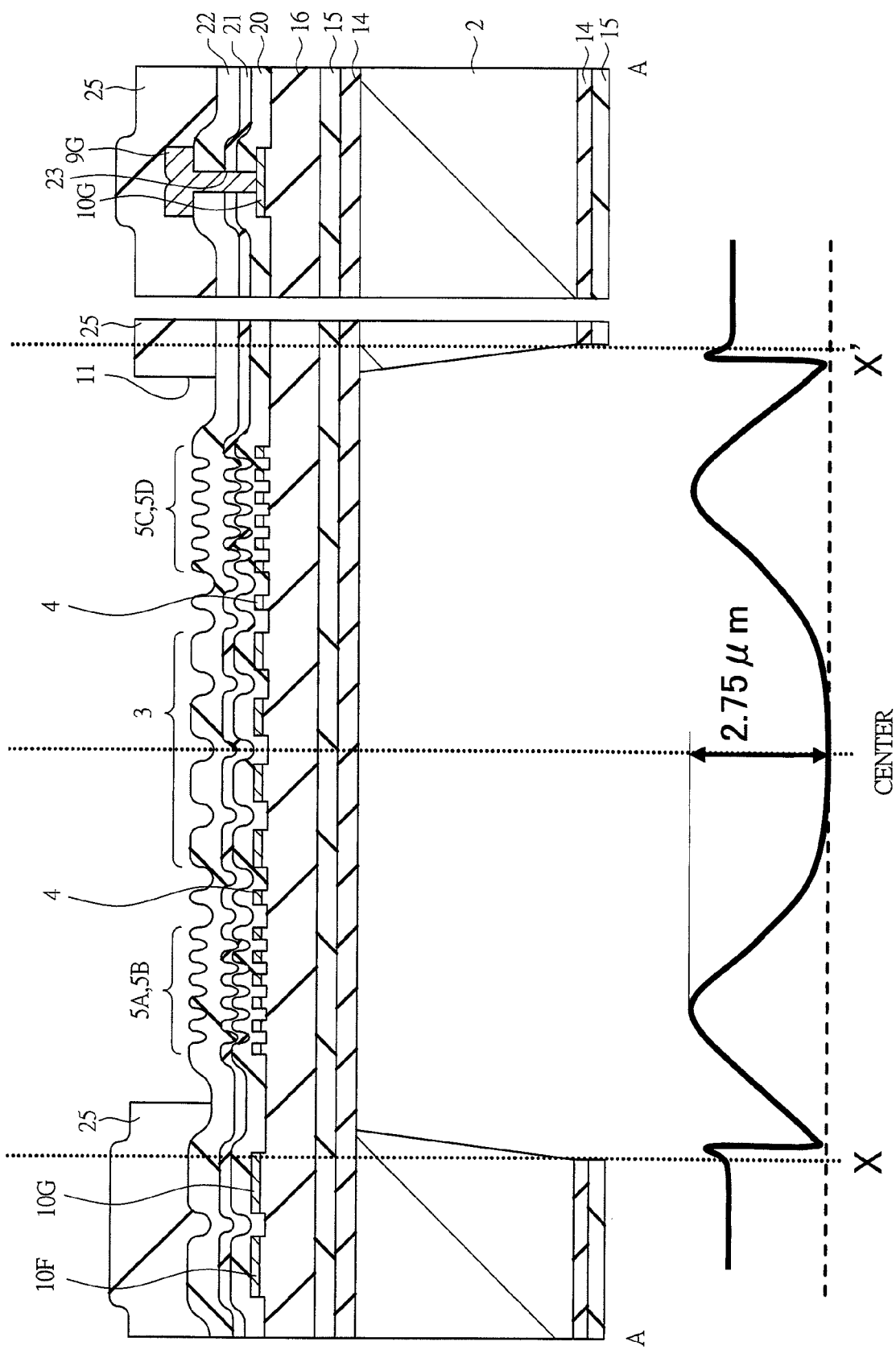
FIG. 12 is an explanatory diagram illustrating a shift amount of a surface of a thermal fluid flow sensor which has been compared to the thermal fluid flow sensor according to the first embodiment of the present invention and studied by the inventor of the present invention.

Next, a shift amount of a diaphragm surface will be described. FIG. 12 is a cross-sectional view of main parts a thermal fluid flow sensor of a conventional system having a diaphragm structure, the sensor having been compared with the diaphragm structure 12 (see FIG. 7) of the present invention and studied by the inventor of the present invention. In plane, FIG. 12 corresponds to the line A-A in FIG. 1 of the first embodiment. In addition, in the conventional thermal fluid flow sensor, a pitch of sensor wirings (the upstream temperature-measuring resistive elements 5A and 5B and the downstream temperature-measuring resistive elements 5C and 5D) is set to about 1.2 μm, and a pitch of the heater wirings (the heater resistive element 3) is set to about 20 and a shift amount of the surface of the sensor is illustrated in FIG. 12.

As illustrated in FIG. 12, the conventional thermal fluid flow sensor has a structure in which the fourth insulating film 17 formed of a silicon nitride film and the fifth insulating film 18 formed of a silicon oxide film of the thermal fluid flow sensor of the present embodiment are omitted. In the configuration of films, a silicon oxide film (the first insulating film 14) formed on the semiconductor substrate 2 by a thermal treatment is about 200 nm, a silicon nitride film (the second insulating film 15) formed by a CVD method is about 200 nm, a silicon oxide film (the third insulating film 16) deposited by a CVD method is about 500 nm, a Mo film (the heater resistive element 3, the temperature-measuring resistive element for heater resistive element 4, the temperature-measuring resistive element (the upstream temperature-measuring resistive elements 5A and 5B and the downstream temperature-measuring resistive elements 5C and 5D), the air-temperature-measuring resistive element 6, the heater-temperature-controlling resistive elements 7 and 8, and the draw-out wirings 10A to 10I2) patterned on the silicon oxide film is about 150 nm, a silicon oxide film (the sixth insulating film 20) deposited by a plasma CVD method using TEOS as a source is about 500 nm, a silicon nitride film (the seventh insulating film 21) deposited by a plasma CVD method is about 150 nm, and a silicon oxide film (the eighth insulating film 22) deposited by a plasma CVD method using TEOS as a source is about 200 nm. To the portions other than the heater, the heater temperature sensor, and the temperature difference sensor, a polyimide film is formed to be about 2 μm as the protective film 25, and the diaphragm structure is formed in which the semiconductor substrate 2 is removed in the region larger than the portions of the heater, the heater temperature sensor, and the temperature difference sensor.

In the structure of the conventional thermal fluid flow sensor as described above, the surface is deflected in the sensor portion (the upstream temperature-measuring resistive elements 5A and 5B and the downstream temperature-measuring resistive elements 5C and 5D) to be raised, and the value of the deflection is larger than the thickness of the protective film 25. As the heater portion (the heater resistive element 3) at the center and the sensor portion (the upstream temperature-measuring resistive elements 5A and 5B and the downstream temperature-measuring resistive elements 5C and 5D) are compared, a shift amount of about 2.75 μm has been observed. Note that the heater resistive element 3, the temperature-measuring resistive element for heater resistive element 4, and the temperature-measuring element (the upstream temperature-measuring resistive elements 5A and 5B and the downstream temperature-measuring resistive elements 5C and 5D) are protruded by about 0.2 μm than the other portion where the pattern is not formed, but the shift amount of the surface has been measured with omitting the protruding step. In a measurement of the shift amount in the whole of the diaphragm structure, only the sensor portion is deflected to be raised upwards, and the shift amount has been smaller than or equal to about 0.1 μm in the other portion where the Mo film is not formed, for example. Therefore, remnant stress only in the sensor portion where the Mo film has been subjected to microprocessing is changed to compressive stress, thereby maintaining tensile stress in the other portion. When such a deflection occurs, deformation of the diaphragm is easily generated like the heater portion being raised upon heating the heater, resulting in a change in the resistance value of the heater portion and the sensor portion. The above-mentioned fixed temperature (ΔTh) to be a reference is calculated from the resistance values of the heater portion and the sensor portion. Thereby, when the thermal fluid flow sensor is operated with setting the setting value while the resistance values are changed, a lowering of detection accuracy due to a lowering of ΔTh and/or a destruction of the film structure itself due to abnormal heater heating caused by an excess current are/is feared.

Figure 13:
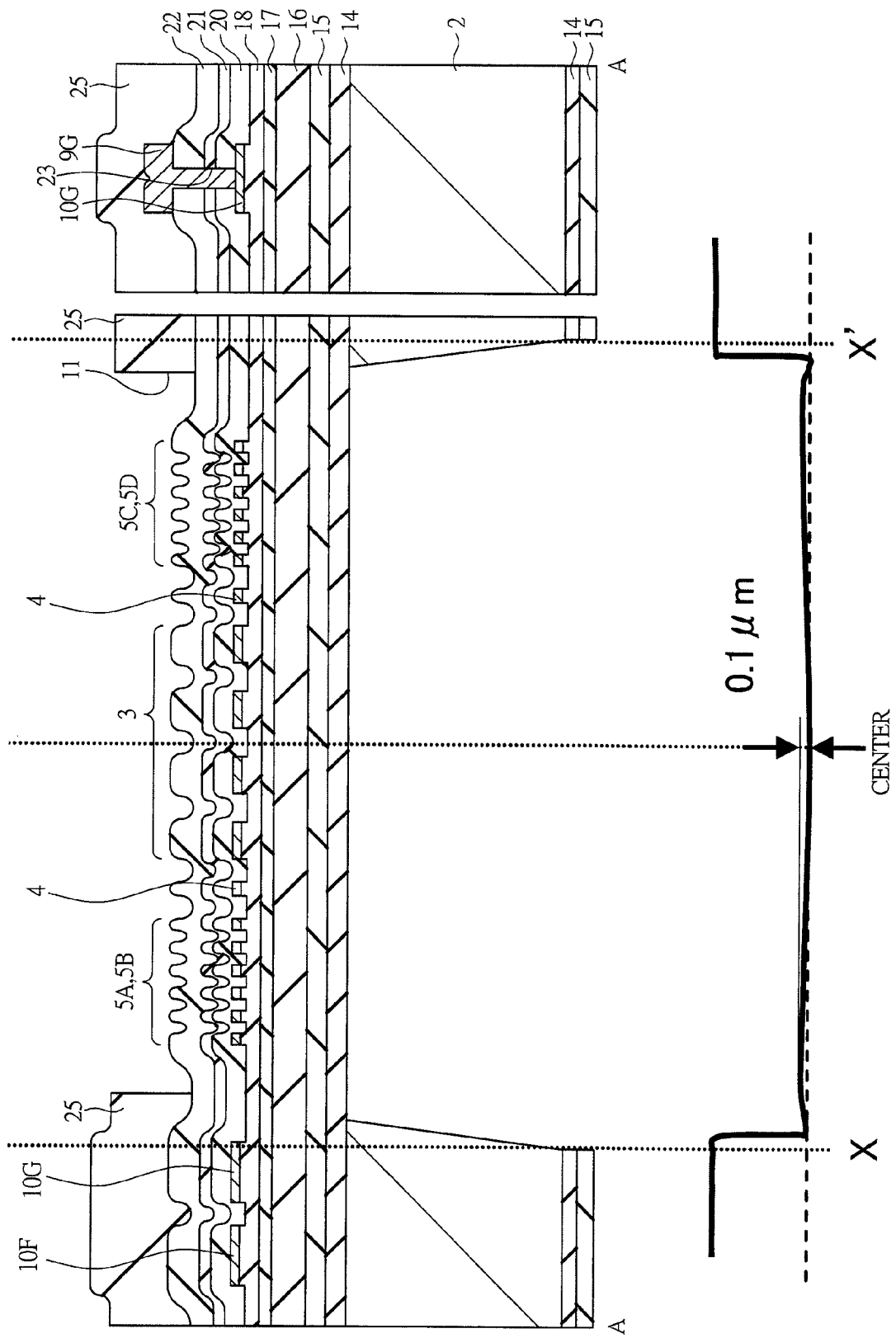
FIG. 13 is an explanatory diagram illustrating a shift amount of a surface of the thermal fluid flow sensor according to the first embodiment of the present invention.

On the other hand, FIG. 13 illustrates a shift amount of the surface of the thermal fluid flow sensor of the present embodiment with setting the pitch of the sensor wirings (the upstream temperature-measuring resistive elements 5A and 5B and the downstream temperature-measuring resistive elements 5C and 5D) to be about 1.2 μm and the pitch of the heater wirings (the heater resistive element 3) to be about 20 μm in the same manner with the conventional thermal fluid flow sensor described above.

In the configuration of each film forming the thermal fluid flow sensor of the present embodiment, a silicon oxide film (the first insulating film 14) formed on the semiconductor substrate 2 by a thermal treatment is about 200 nm, a silicon nitride film (the second insulating film 15) formed by a CVD method is about 200 nm, a silicon oxide film (the third insulating film 16) deposited by a CVD method is about 350 nm, a silicon nitride film (the fourth insulating film 17) for compensating the tensile stress of the silicon nitride film above is about 140 nm, a silicon oxide film (the fifth insulating film 18)

above the silicon nitride film is about 150 nm, a Mo film (the heater resistive element 3, the temperature-measuring resistive element for heater resistive element 4, the temperature-measuring resistive element (the upstream temperature-measuring resistive elements 5A and 5B and the downstream temperature-measuring resistive elements 5C and 5D), the air-temperature-measuring resistive element 6, the heater-temperature-controlling resistive elements 7 and 8, and the draw-out wirings 10A to 10I2) patterned on the silicon oxide film is about 150 nm, a silicon oxide film (the sixth insulating film 20) deposited by a plasma CVD method using TEOS as a source is about 500 nm, a silicon nitride film (the seventh insulating film 21) deposited by a plasma CVD method is about 150 nm, and a silicon oxide film (the eighth insulating film 22) deposited by a plasma CVD method using TEOS as a source is about 200 nm. To the portions other than the heater, heater temperature sensor, and the temperature difference sensor, a polyimide film is formed to be about 2 μm as the protective film 25, and the diaphragm structure is formed in which the semiconductor substrate 2 is removed in the region larger than the portions of the heater, heater temperature sensor, and the temperature difference sensor.

In such a diaphragm structure of the thermal fluid flow sensor of the present embodiment, the shift amount of the surface can be about only 0.1 μm when comparing the heater portion and the sensor portion at the center, the shift amount being reduced to be about ½₈ (one-twenty-eighth) of the shift amount in the conventional thermal fluid flow sensor. In other words, the deflection occurring in the diaphragm structure can be largely reduced, thereby preventing changes in the resistance values of the heater portion and the sensor portion, and preventing malfunctions such as a lowering in the detection accuracy due to a lowering of ΔTh and/or destruction of the film structure body due to abnormal heating caused by an excess current.

Figure 14:
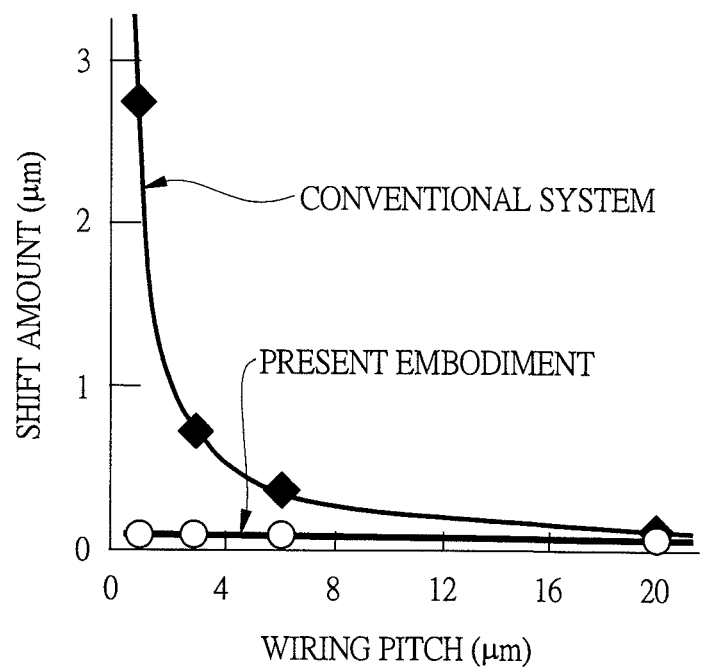
FIG. 14 is an explanatory diagram illustrating a relation between a wiring pitch and a shift amount of surfaces of the thermal fluid flow sensors.

FIG. 14 is a diagram illustrating a correlation of the pitch of the sensor wirings (the upstream temperature-measuring resistive elements 5A and 5B and the downstream temperature-measuring resistive elements 5C and 5D) and the shift amount of the surface of the diaphragm structure portion in the thermal fluid flow sensor of the present embodiment and that of the conventional thermal fluid flow sensor described above. In FIG. 14, the horizontal axis is the pitch of the sensor wirings and the vertical axis is the shift amount of the surface of the diaphragm structure.

As illustrated in FIG. 14, in the conventional thermal fluid flow sensor, the shift amount of the surface of the diaphragm structure portion is increased when the wiring pitch is smaller than or equal to about 6 nm, more particularly, the shift amount is drastically increased when the wiring pitch is smaller than or equal to about 1.2 μm. Meanwhile, in the thermal fluid flow sensor of the present embodiment, the shift amount of the surface of the diaphragm structure is about 0.1 μm even when the wiring pitch is as minute as 1.2 μm. Thus, it is understood that an imbalance of stress in the insulating film in the diaphragm structure is resolved in the present embodiment. Note that, in the present embodiment, as compared with the conventional system, the silicon nitride film (the fourth insulating film 17) having a thickness of about 140 nm is added at a lower layer of the wiring layer formed of the first metal film 19 (see FIG. 2) corresponding to the wiring pitch set to about 1.2 μm. By setting the thickness of the silicon nitride film corresponding to the wiring pitch, the shift amount of the surface of the diaphragm structure can be reduced.

Also, in the present embodiment, it has been described that the tensile stress of the silicon nitride film (the seventh insulating film 21) formed of the first metal film 19 (see FIG. 2) on the wiring has remnant stress of about 700 MPa to 1000 MPa. Meanwhile, as the silicon nitride film on the wiring plays a large role of preventing moisture absorption, the remnant stress may not be within the above-mentioned range.

However, when the remnant stress is not within the range, it is necessary to add a silicon nitride film in consideration of the whole remnant stress at a lower layer of the wiring, and the number of layers of the silicon nitride film to be formed at the lower layer of the wiring can be three or more when a film having compressive stress (e.g., a silicon oxide film) is interposed therebetween. Also, the remnant stress may be compressive stress depending on the temperature upon deposition even in a silicon nitride film. Thus, depending on the temperature in the environment of using the thermal fluid flow sensor, the remnant stress is changed from tensile stress to compressive stress and vice versa even in the same film. Therefore, selection of the number of layers of these silicon nitride films and the silicon oxide films and/or the species of the films themselves can be suitably set depending on the environment of using the thermal fluid flow sensor.

Figure 15:
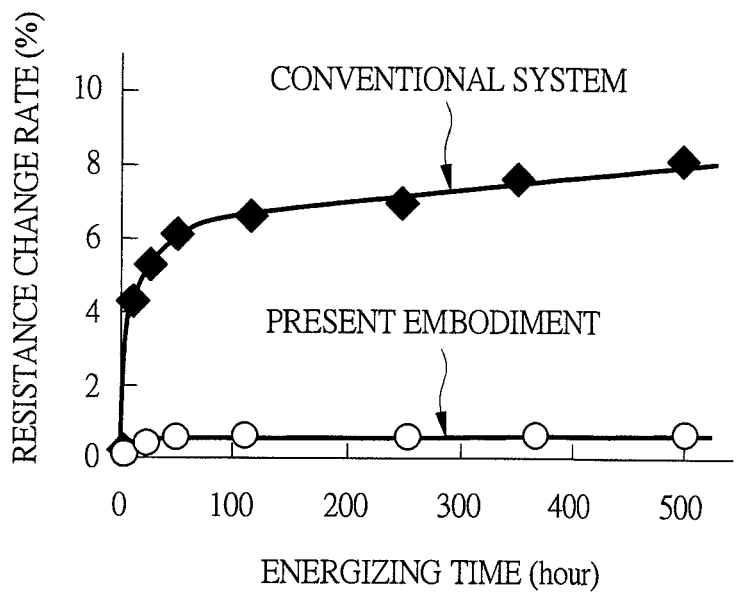
FIG. 15 is an explanatory diagram illustrating a relation between a total energizing time and a resistance change rate.

FIG. 15 illustrates a resistance change rate of the heater portion per total energizing time when the heater portion (the heater resistive element 3) is energized to be 500° C. In FIG. 15, the conventional thermal fluid flow sensor (see FIG. 12) and the thermal fluid flow sensor of the present embodiment (see FIG. 13) are compared in conditions of having the pitch of the sensor wirings (the upstream temperature-measuring resistive elements 5A and 5B and the downstream temperature-measuring resistive elements 5C and 5D) of 1.2 μm and the pitch of the heater wirings (the heater resistive element 3) of 20 μm.

As illustrated in FIG. 15, in the conventional thermal fluid flow sensor, the surface of the sensor portion is deflected like a convex and thus the resistance value of the heater portion is drastically changed even though the surface of the heater portion is in almost the same plane with the uppermost silicon oxide film (the eighth insulating film 22) (see FIG. 22 also). On the other hand, in the thermal fluid flow sensor of the present embodiment, about a 0.5% resistance value change was observed in the initial period of energization but there is no change observed in the resistance value thereafter. Note that, also as to the heater temperature sensor (the temperature-measuring resistive element for heater resistive element 4) in a condition of energizing the heater portion at about 500° C., it has been confirmed that the conventional thermal fluid flow sensor has a large resistance value change, and the thermal fluid flow sensor of the present embodiment has almost no resistance value change. Therefore, by making the shift amount of the surface between the sensor portion and the heater portion small, a thermal fluid flow sensor having a high reliability can be achieved.

Note that, in the conventional thermal fluid flow sensor, means of ensuring the tensile stress of the diaphragm structure by simply thickening the silicon nitride film (the second insulating film 15) at a lower layer of the Mo film (the first metal film 19) may be considered. However, since the silicon nitride film has very large remnant stress of 700 MPa to 1000 MPa, warpage of the wafer (the semiconductor substrate 2) is increased when the thickness exceeds 200 nm. Therefore, it is feared that an error in chucking wafers in an apparatus is posed in the upcoming processes after forming the silicon nitride film (the second insulating film 15), and thus adverse effects such as cracks in the silicon nitride film, exfoliation of the film, and/or wafer cracking are/is feared to occur.

In the above point of view also, as described in the present embodiment, the film having tensile stress is stacked by two layers or more to have a thickness smaller than or equal to 200 nm, and it is preferable to interpose a film having compressive stress between the tensile stress films instead of sequentially stacking the tensile stress films in view of mitigating inertial stress. Consequently, thermal stress resistance can be improved.

Further, since the thickness of the whole diaphragm structure becomes thicker by the added silicon nitride film, the mechanical strength is increased, thereby improving the dust collision resistance.

Second Embodiment

In a second embodiment, prevention of warpage of a wafer due to remnant stress which a film deposited on the wafer (the semiconductor substrate 2) has is considered.

Figure 16:
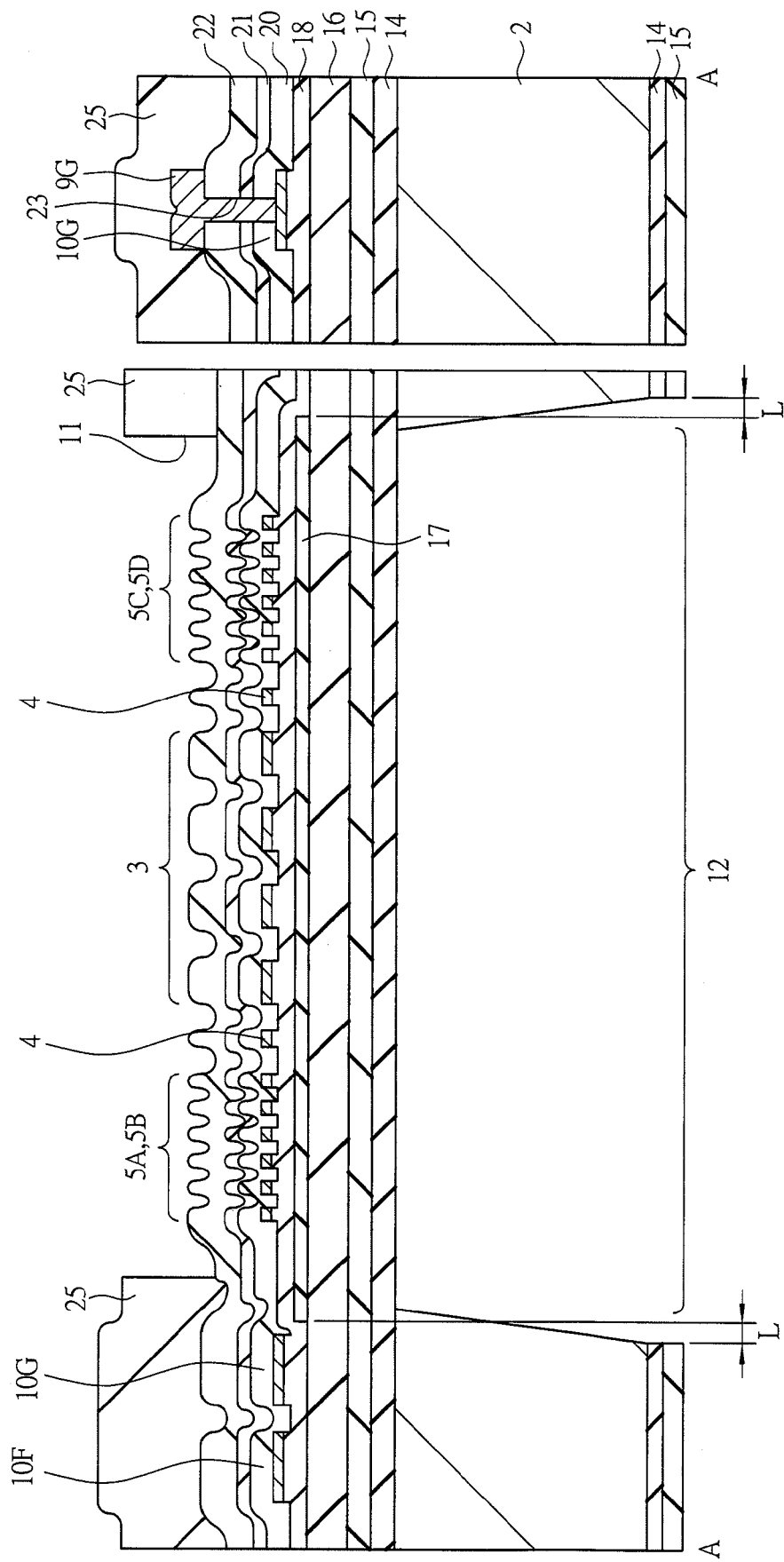
FIG. 16 is a cross-sectional view of main parts of a thermal fluid flow sensor according to a second embodiment of the present invention.

FIG. 16 illustrates an example of a thermal fluid flow sensor according to the second embodiment, illustrating a cross-sectional view of main parts taken along the line A-A in FIG. 1 of the first embodiment.

Thicknesses of respective films configuring the thermal fluid flow sensor of the second embodiment are the same with those of the first embodiment except for the fourth insulating film 17 (a silicon nitride film) having a thickness of about 200 nm (it has been about 140 nm in the first embodiment).

Next, a manufacturing process of the thermal fluid flow sensor according to the second embodiment will be described. Note that the manufacturing process of the thermal fluid flow sensor of the second embodiment is the same with that of the first embodiment until the step of depositing the fourth insulating film 17 (see FIG. 2).

Subsequently, the fourth insulating film 17 is processed with dry etching using a photoresist pattern patterned by a photolithography method as a mask or the like. In the processing, the fourth insulating film 17 is arranged to cover at least the region of the wiring portion in the diaphragm in plane, and spacing L between the outer circumference of the fourth insulating film 17 and the outer circumference of the diaphragm structure 12 is preferably larger than or equal to 10 μm. By the patterning, the fourth insulating film 17 formed of a silicon nitride film is remained only inside the diaphragm structure 12, so that warpage of the wafer (the semiconductor substrate 2) due to strong tensile stress of the fourth insulating film 17 is mitigated, and thus troubles in wafer transfer in a plasma CVD apparatus which requires electrostatic chucking and/or a stepper apparatus used in a photolithography step which uses vacuum contact can be avoided.

Upcoming steps from the step of depositing the fifth insulating film 18 are the same with those of the first embodiment. Meanwhile, in the second embodiment, the thickness of the seventh insulating film 21 (silicon nitride film) is about 150 nm to 200 nm, and the thickness of the eighth insulating film 22 (silicon oxide film) is about 300 nm.

In the foregoing, the invention made by the inventor of the present invention has been concretely described based on the embodiments. However, it is needless to say that the present invention is not limited to the foregoing embodiments and various modifications and alterations can be made within the scope of the present invention.

Other than the thermal fluid flow sensor according to the above-described embodiments, the present invention is applicable to various sensors such as an acceleration sensor, a temperature sensor, and a gas sensor.

What is claimed is:

1. A thermal fluid flow sensor comprising:
    a heater resistive element provided in a structure forming a diaphragm and a temperature-measuring resistive element provided next to the heater resistive element, the thermal fluid flow sensor measuring an air flow rate,
    an upper insulating portion, which includes a first insulating film having tensile stress and a second insulating film having compressive stress stacked over an upper layer of the heater resistive element and the temperature-measuring resistive element, and
    a lower insulating portion, which includes a third insulating film having tensile stress, a fourth insulating film having compressive stress, and a fifth insulating film having tensile stress stacked in order, from bottom to top, under a lower layer of the heater resistive element and the temperature-measuring resistive element.

2. The thermal fluid flow sensor according to claim 1, wherein
    the first, third, and fifth insulating films are silicon nitride films or aluminum nitride films having a tensile stress with remnant stress at room temperature of 700 MPa or more.

3. The thermal fluid flow sensor according to claim 1, wherein
    the second and fourth insulating films are silicon oxide films or films containing silicon oxide as a main component formed by a plasma CVD method using TEOS (tetraethyl orthosilicate) as a source, and having a compressive stress with remnant stress at room temperature of 300 MPa or lower.

4. The thermal fluid flow sensor according to claim 1, wherein
    the lower insulating portion includes a sixth insulating film having compressive stress and a seventh insulating film having compressive stress,
    the sixth, third, fourth, fifth, and seventh insulating films are stacked in order, from bottom to top, under the lower layer of the heater resistive element and the temperature-measuring resistive element, and
    a remnant stress at room temperature of the lower insulating portion is tensile stress.

5. The thermal fluid flow sensor according to claim 1, wherein
    a wiring pitch of the temperature-measuring resistive element is smaller than or equal to 20 μm.

6. The thermal fluid flow sensor according to claim 5, wherein
    the wiring pitch of the temperature-measuring resistive element is smaller than or equal to 6 μm.

7. The thermal fluid flow sensor according to claim 1, wherein
    the upper insulating portion includes a silicon nitride film.

8. The thermal fluid flow sensor according to claim 1, wherein
    a number of silicon nitride film layers in the lower insulating portion is larger than a number of silicon nitride film layers in the upper insulating portion.

9. The thermal fluid flow sensor according to claim 1, wherein
    a number of film layers in the lower insulating portion is different from a number of film layers in the upper insulating portion.

10. The thermal fluid flow sensor according to claim 1, wherein
    the structure forming the diaphragm is configured by the upper and lower insulating portions, and
    a total thickness of the upper and lower insulating portions is larger than or equal to 1.5 μm.

11. The thermal fluid flow sensor according to claim 1, wherein the heater resistive element and the temperature-measuring resistive element are formed of a metal film, a metal nitride compound, a metal silicide compound, poly-silicon, or doped silicon, the metal film contains any of molybdenum, alpha-tantalum, titanium, tungsten, cobalt, nickel, iron, niobium, hafnium, chrome, zirconium, platinum, or beta-tantalum as its main component, the metal nitride compound is any of tantalum nitride, molybdenum nitride, tungsten nitride, or titanium nitride, the metal silicide compound is any of tungsten silicide, molybdenum silicide, cobalt silicide, or nickel silicide, and phosphorus or boron is doped in the doped silicon.

12. The thermal fluid flow sensor according to claim 1, wherein the fifth insulating film is provided in a region inside the diaphragm and covering a microprocessed wiring portion region of the diaphragm in plan view, and a distance between an edge of the fifth insulating film and an edge of an opening in the structure forming the diaphragm is, in the plan view, more than or equal to 10 μm.

13. A thermal fluid flow sensor comprising:

a heater resistive element provided in a structure forming a diaphragm;

a temperature-measuring resistive element provided next to the heater resistive element;

an upper insulating portion, which includes a first insulating film of silicon nitride and a second insulating film of silicon oxide stacked over an upper layer of the heater resistive element and the temperature-measuring resistive element; and a lower insulating portion, which includes a third insulating film of silicon nitride, a fourth insulating film of silicon oxide, and a fifth insulating film of silicon nitride stacked in order, from bottom to top, under a lower layer of the heater resistive element and the temperature-measuring resistive element.

14. The thermal fluid flow sensor according to claim 13, wherein the first, third, and fifth insulating films have tensile stress with remnant stress at room temperature.

15. The thermal fluid flow sensor according to claim 13, wherein the lower insulating portion includes a sixth insulating film of silicon oxide and a seventh insulating film of silicon oxide, the sixth, third, fourth, fifth, and seventh insulating films are stacked in order, from bottom to top, under the lower layer of the heater resistive element and the temperature-measuring resistive element, and the lower insulating portion has tensile stress with remnant stress at room temperature.

16. The thermal fluid flow sensor according to claim 13, wherein a number of silicon nitride film layers in the lower insulating portion is larger than a number of silicon nitride film layers in the upper insulating portion.

17. The thermal fluid flow sensor according to claim 13, wherein a number of film layers in the lower insulating portion is different from a number of film layers in the upper insulating portion.

18. The thermal fluid flow sensor according to claim 13, wherein the fifth insulating film is provided in a region inside the diaphragm and covering a microprocessed wiring portion region of the diaphragm in plan view, and a distance between an edge of the fifth insulating film and an edge of an opening in the structure forming the diaphragm is, in the plan view, more than or equal to 10 μm.

* * * * *